(12) United States Patent
Hockley et al.

(10) Patent No.: US 7,578,908 B2
(45) Date of Patent: Aug. 25, 2009

(54) SPUTTER COATING SYSTEM

(75) Inventors: Peter J. Hockley, Milford on Sea (GB); Michael Thwaites, Hook (GB)

(73) Assignee: Plasma Quest Limited, Hook (GB)

( * ) Notice: Subject to any disclaimer, the term of this patent is extended or adjusted under 35 U.S.C. 154(b) by 554 days.

(21) Appl. No.: 11/256,193

(22) Filed: Oct. 24, 2005

(65) Prior Publication Data
US 2006/0090999 A1 May 4, 2006

(30) Foreign Application Priority Data
Oct. 22, 2004 (GB) ................. 0423502.4

(51) Int. Cl.
C23C 14/34 (2006.01)

(52) U.S. Cl. .............. 204/192.12; 204/298.16; 204/298.18; 204/298.19; 204/298.21; 204/298.22; 204/298.23

(58) Field of Classification Search ............ 204/192.12, 204/298.16, 298.18, 298.19, 298.21, 298.22, 204/298.23, 298.06
See application file for complete search history.

(56) References Cited

U.S. PATENT DOCUMENTS

| | | | | |
|---|---|---|---|---|
| 4,221,652 A | * | 9/1980 | Kuriyama | 204/298.22 |
| 4,911,814 A | * | 3/1990 | Matsuoka et al. | 204/298.17 |
| 5,084,300 A | | 1/1992 | Zander et al. | |
| 5,096,562 A | | 3/1992 | Boozenny et al. | |
| 5,122,251 A | * | 6/1992 | Campbell et al. | 204/298.06 |
| 5,354,443 A | | 10/1994 | Moslehi | |
| 5,387,247 A | | 2/1995 | Vallana et al. | |
| 5,427,665 A | * | 6/1995 | Hartig et al. | 204/192.12 |
| 5,464,518 A | * | 11/1995 | Sieck et al. | 204/192.12 |
| 5,660,700 A | * | 8/1997 | Shimizu et al. | 204/298.08 |
| 5,988,103 A | | 11/1999 | Fetherston et al. | |
| 2003/0066486 A1 | | 4/2003 | Zheng et al. | |
| 2004/0173455 A1 | | 9/2004 | Wang | |

FOREIGN PATENT DOCUMENTS

| | | |
|---|---|---|
| EP | 0 328 076 A2 | 8/1989 |
| GB | 2 243 992 A | 5/2000 |
| JP | 5-65634 | 3/1993 |

OTHER PUBLICATIONS

GB Search Report dated Feb. 28, 2006.
European Search Report for App. No. EP 05 25 6564 dated May 29, 2007.

* cited by examiner

*Primary Examiner*—Rodney G McDonald
(74) *Attorney, Agent, or Firm*—Nixon & Vanderhye PC

(57) ABSTRACT

A sputter coating system comprises a vacuum chamber, means for generating a vacuum in the vacuum chamber, a gas feed system attached to the vacuum chamber, a gas plasma forming system attached to the vacuum chamber, a system for confining and guiding a gas plasma within the vacuum chamber, and a prism-shaped sputter target assembly, with the material to be sputtered forming at least the outer surface of the target assembly and positioned such that the outer surface is surrounded by the plasma within the vacuum chamber. A negative polarity voltage is applied to the surface of the material such that sputtering occurs.

23 Claims, 2 Drawing Sheets

SPUTTER COATING SYSTEM

BACKGROUND TO THE INVENTION

1. Field of the Invention

This invention relates to a system for sputter coating.

2. Description of the Prior Art

Sputtering processes are widely used for the deposition of thin films of materials onto various substrates. In general, the process takes place within a vacuum chamber in which a small quantity of ionisable process gas, for example argon, is present. At appropriate process gas pressures a plasma may be produced through ionisation of the gas by well known means, for example the application of a high voltage between two electrodes within the chamber. A target material, which may itself form the negative (cathode) electrode, is bombarded by positive plasma ions and if the ion bombardment is of sufficient energy target atoms are ejected from the target surface into the vacuum. A substrate placed within the vacuum system, usually with line of sight to and in proximity to the target surface being bombarded, may then be coated by the released target material.

A simple plasma sputtering system, comprising for example of two metal plates separated at an appropriate distance and with a suitable DC voltage between them, is only efficient or useful under a narrow range of process conditions and therefore limited in its application. The evolution of sputtering technology has greatly improved upon such simple systems in the drive to achieve higher deposition rates, better uniformity and properties of deposited films, and wider ranges of materials that can be sputtered. Thus it is well known that AC voltages, usually at radio frequencies (RF) and typically 13.56 MHz can be used, for example to allow the sputtering of insulators, and that magnetic fields can be used to confine or direct plasma electrons, for example to locally increase the plasma energy at the target to enhance sputtering rates. It should be noted that, in general, the achievement of higher deposition rates is a primary commercial goal for sputter systems.

As an example, a circular "magnetron" sputter target assembly has a torus shaped magnetic field penetrating the target material surface to confine plasma electrons and induce a far higher local ionisation level (or 'plasma density') than would otherwise be possible. This allows high sputtering rates to be achieved at low gas pressures, typically $1 \times 10^{-3}$ to $7 \times 10^{-3}$ torr, resulting in high material deposition rates onto substrates and high quality of the deposited thin films. As a result, sputter deposition apparatus using magnetron based designs are extensively used e.g. in the semiconductor and opto-electronic industries.

A variation of the sputter process is reactive sputtering, wherein a process gas or a component of a process gas mixture reacts with the sputtered target material or the deposited thin film to produce a compound material. As an example, an aluminium target may be sputtered under appropriate conditions in a plasma struck in a gas mixture of argon and oxygen to deposit an aluminium oxide film.

To further increase deposition rates and system capability, and overcome some of the limitations imposed by magnetron sputtering systems, it is known that a plasma density of $10^{11}$ cm$^{-3}$ or more, hereinafter a "high density plasma", can be produced remotely from and independently of the target and then directed to its vicinity by electric and/or magnetic fields.

The major change resulting from using remotely generated plasma is that the sputter target assembly is not required to produce, sustain or contribute energy to the high density plasma. This permits the elimination of the toroidal magnetic field used in the magnetron designs with the result that with the remotely generated plasma guided to the target surface sputtering takes place over the whole target surface, not just the ring of material within the torus.

Effectively the process advantages of the magnetron design are retained whilst a major disadvantage is eliminated. For an appropriately designed and operated system, the plasma density delivered to the target surface is comparable to or greater than that which would be generated in the localised torus of the magnetron design. Since all areas of the target therefore sputter material at the same high rate as is achieved only locally in the magnetron design, the overall deposition rate that may be achieved from the target is greatly increased, typically by a factor of 3 to 5 over the magnetron based system, substantially more when compared to the simple DC or AC powered 'parallel plate' based sputter systems.

A variety of techniques are known that may be used to generate remote, high density plasmas, as summarised by Popov in 'High Density Plasma Sources' (1995). For example the electron cyclotron resonance (ECR) phenomena may be used to produce a plasma by coupling a microwave source with a strong magnetic field in vacuum.

As a further example high density plasma waves may be generated by the use of an external antenna powered with 13.56 MHz radio frequency signal, as shown in original papers by Boswell and subsequently Chen. These have the advantage of using lower magnetic field strengths compared with ECR, but require careful antenna and magnetic field design to ensure the efficient production and propagation of the 'helicon wave' electrons which are used to generate the high plasma densities.

A further, more efficient plasma wave source is used in a sputter deposition system invented by Thwaites (United Kingdom Patent No. 2 343 992). This utilises a helically wound coil antenna in conjunction with non-linear magnetic fields to both produce a high density plasma and to direct this to a target surface out of line of sight of the plasma source. The plasma source has the advantages of a simpler, more robust antenna and magnetic field design than the 'helicon' systems and is found to be more efficient in practice.

A limitation of all the disclosed sputter systems is that the target material is ejected in a limited angular arc, therefore limiting the size of the coating area in which substrates may be placed. The angular arc limitation requires that large and therefore expensive vacuum systems, often with many sputter target assemblies, be assembled to efficiently coat large areas and/or large numbers of substrates.

An additional limitation of the disclosed sputter systems is the limited dimensions of the high intensity sputter region that thereby restrict the deposition rate that can be achieved and/or limit the number and size of substrates that may be coated. For example circular magnetron sources sputter from only the magnetic torus, representing less than 20% of the target area; a 200 mm diameter target therefore delivers no more sputtered material than a 90 mm diameter target would if uniformly sputtered.

The remote plasma systems can sputter from the entire target surface, but require a plasma source size of comparable dimension to the target to be sputtered. This generally limits the maximum commercially realistic target size to less than 300 mm diameter. Additionally, geometric and layout requirements for successful implementation of the systems result in larger target to substrate separations being needed; as the deposition rate decreases proportional to the square of the separation distance, the gains anticipated from the large targets may not be realised in practice.

BRIEF SUMMARY OF THE INVENTION

According to an aspect of the invention, there is provided a sputter coating system comprising a vacuum chamber, means for generating a vacuum in the vacuum chamber, a gas feed system attached to the vacuum chamber, a gas plasma forming system attached to the vacuum chamber, a system for confining and guiding a gas plasma within the vacuum chamber, and a prism-shaped sputter target assembly, with the material to be sputtered forming at least the outer surface of the target assembly and positioned such that the outer surface is surrounded by the plasma within the vacuum chamber. A negative polarity voltage is applied to the surface of the material such that sputtering occurs.

WRITTEN DESCRIPTION OF THE BEST MODE FOR CARRYING OUT THE INVENTION

Figure 1:
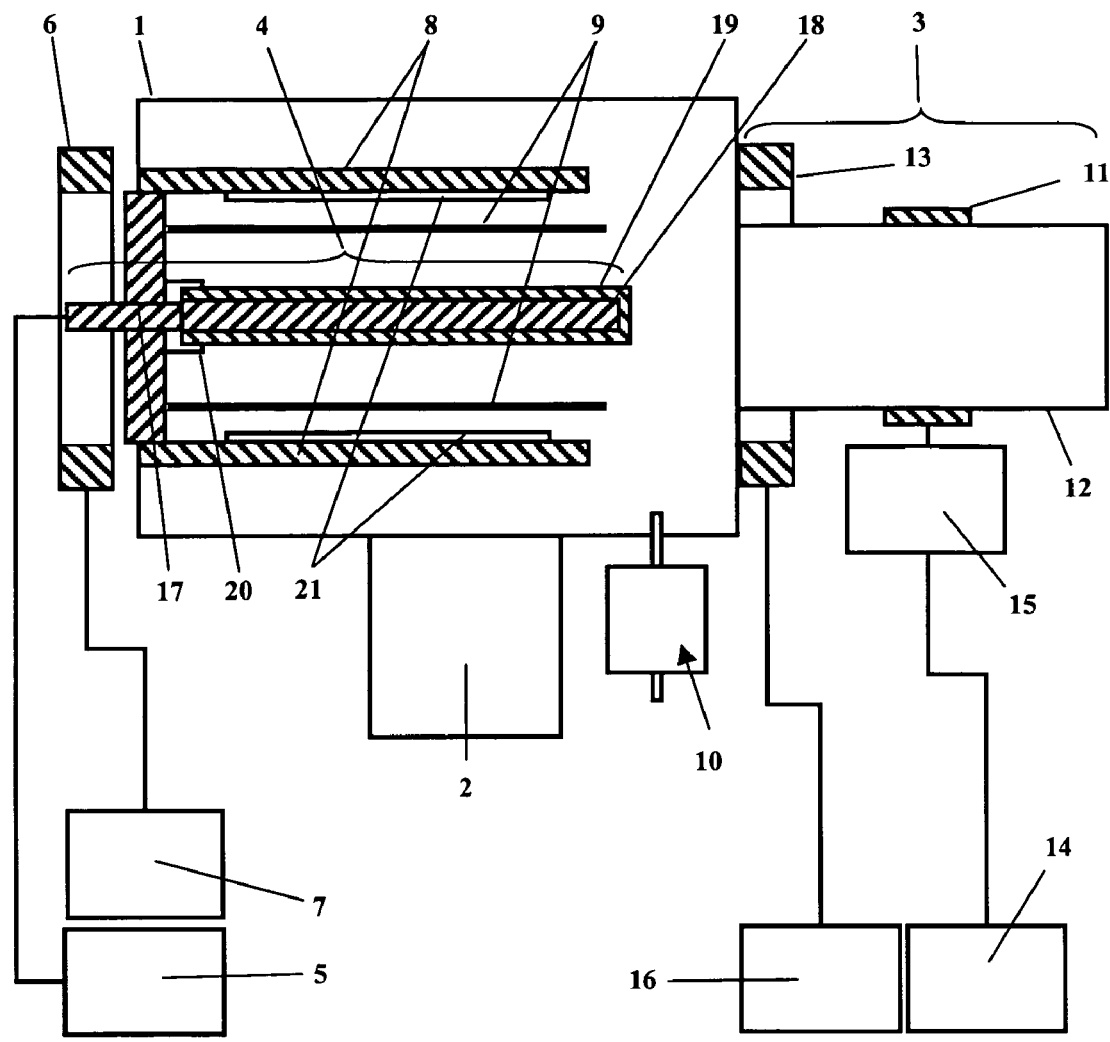
FIG. 1 is a schematic cross section of a preferred embodiment of the apparatus.

In the preferred embodiment of the apparatus, a vacuum chamber 1 and controllable means of vacuum pumping the chamber by a pumping system 2 are fitted with a remote plasma generation system 3, a cylindrical target assembly 4, a DC power supply 5, a ring electromagnet 6 and associated DC power supply 7 capable of producing an axial magnetic field of 100 to 500 Gauss, substrate carriers 8, shutter assemblies 9 and a controllable process gas feed system 10.

The remote plasma generation system 3 comprises a coil antenna 11 external to a quartz tube 12 that is mounted on the vacuum chamber 1, a ring electromagnet 13 surrounding the quartz tube 12 at or near its connection to the vacuum chamber 1, a 13.56 MHz AC RF generator 14 and impedance matching network 15 connected to the coil antenna 11, and a DC power supply 16 electrically connected to the ring electromagnet 13 and in combination capable of producing an axial magnetic field of 100 to 500 Gauss.

The cylindrical target assembly 4 comprises a vacuum chamber feedthrough 17 that feeds water and electric services to a mounting assembly 18, this being thereby water cooled and capable of having a voltage applied to it from sources external to the vacuum chamber. Additionally a target material 19 is fitted around the mounting assembly 18, ensuring good electrical and thermal contact by means well known in the art. Additionally in order to prevent sputtering of the feedthrough 17 and mounting assembly 18 a shield 20 that is electrically grounded is provided around these items where they mount to the chamber.

The substrate carriers 8 essentially provide a means to position and hold the substrates 21 that are to be coated within the vacuum chamber. The carriers may be water cooled or include heaters to control the substrates temperature, be capable of having a voltage applied to them to assist control of deposited film properties, include means of rotating and/or tilting the substrates to improve uniformity, and themselves be capable of being moved and/or rotated within the vacuum chamber.

The shutter assembly 9 is provided such that in the 'closed' position target sputtering can take place without coating the substrates.

The process gas feed system 10 comprises one or more gas inlets for one or more process gases or process gas mixtures, each gas flow being controllable for example using commercial mass flow controllers, and optionally including gas mixing manifolds and/or gas distribution systems within the vacuum chamber. In the simplest embodiment of the invention, a single gas inlet is provided to the vacuum chamber, the process gas or gases then being distributed to all parts of the vacuum by normal low pressure diffusion processes or directed pipework.

In this embodiment, the target assembly is constructed so as to provide a stainless steel target material surface of 12 mm diameter and approximately 275 mm exposed length, and placed within the plasma cylinder in the vacuum chamber. The substrates 21 to be coated, which in this example are made of glass, are loaded into the substrate carriers 8 at a distance of 110 mm from the target. The shutter assemblies 9 are set to the closed position. The vacuum chamber 1 is then pumped by the pumping system 2 to a vacuum pressure suitable for the process, for example less than $1 \times 10^{-5}$ torr. The process gas feed system 10 is then used to flow at least one process gas, for example argon, into the vacuum chamber. The flow rate and optionally the rate of vacuum pumping are adjusted to provide a suitable operating pressure for the sputter process, for example $3 \times 10^{-3}$ torr. The electromagnets 6 and 13 in conjunction with their respective power supplies 7 and 16 are then used to produce a magnetic field of strength approximately 100 to 300 Gauss across the vacuum chamber.

The precise shape and strength of this magnetic field is to an extent determined by the precise geometry and requirements of the remainder of the system. In this example ring electromagnet 13 is powered to produce a magnetic field strength of 200 Gauss at its centre; ring electromagnet 6 is powered to produce a magnetic field strength of 200 Gauss to 250 Gauss at its centre. The magnetic 'polarity' of each is identical (i.e. they attract), resulting in an approximately cylindrical magnetic flux running across the chamber.

The remote plasma is generated by applying RF power, for example 2 kW, from the generator 14 via the matching network 15 to the coil antenna 11. In combination with the magnetic field produced as described above, this results in a high density plasma being produced across the chamber and surrounding the target assembly 4. In this example, the plasma conditions are set to be an argon gas flow of 18.5 sccm, a vacuum system pressure of $4 \times 10^{-3}$ torr, 0.75 kW RF power applied to the coil antenna and the coil electromagnet 13 axial magnetic field at approximately 200 Gauss and the coil electromagnet 6 axial magnetic field at approximately 250 Gauss. This produces an intense argon plasma of characteristic light blue colouration denoting the presence of a plasma density of approximately $1 \times 10^{13}$ cm$^{-3}$.

The remote plasma generation system in this example produces a cylindrical plasma of approximately 80 mm diameter which can be guided into the vacuum chamber and constrained to the same approximately cylindrical form and diameter by the ring electromagnets 6 and 13. The plasma originating from the remote plasma generation source can be guided and shaped using the ring electromagnets 6 and 13 to completely cover the whole target material surface, with no loss or non-uniformity of plasma density, i.e. the presence of the target material does not block or detrimentally affect the plasma.

A further advantage of the system herein described is that the target assembly does not substantially heat up, even in the absence of water cooling, despite being placed within the high density plasma. The plasma produced by the remote plasma system and constrained by the magnetic field is not disrupted by the presence of the target. This is because although the plasma is cylindrical overall, the plasma generation region is tubular and of a diameter similar to that of the quartz tube 12 and therefore not intercepted by the smaller diameter target. As the plasma generation region is also the region into which most of the remote plasma generation system energy is directed, only items intercepting this region are substantially heated.

The DC power supply 5 is then used to apply a negative polarity voltage to the cylindrical target assembly 4. This results in ions from the plasma in the vicinity of the target being attracted to the target and, if the voltage is above the sputter threshold value for the target material (typically in excess of 65 volts), sputtering of the target material will occur. As the sputter rate for this example system is approximately proportional to the voltage above this threshold value, voltages of 600 volts or more will usually be applied; for very high rate applications higher voltages may be used, for example 1200 volts.

In this example, a negative polarity DC voltage of 500V is applied to the target assembly (and thereby the target material) for a period of one minute using the DC power supply 5. The plasma density required to produce this current is in the order of $1.76 \times 10^{13}$ cm$^{-3}$.

After an optional time delay to allow the target surface to clean and stabilise, for example 5 minutes, the shutter assemblies 9 are set to the open position to expose the surface of substrates 21 facing the cylindrical target assembly to the sputtered material, thereby coating the substrate surfaces with a film of the target material 19. After a time determined by the required film thickness and the deposition rate at the substrate surface, the shutter assemblies 9 are set to the closed position and deposition onto the substrates ceases.

The various power supplies and gas flows can then be turned off as required and the vacuum system vented to atmospheric pressure using a suitable gas, for example nitrogen or air, to permit recovery and subsequent use of the coated substrates.

Using a system such as herein described, and using stainless steel as the target material, substrates may be coated with a film of stainless steel of thickness 70 nm, corresponding to a deposition rate of 1.17 nm.s$^{-1}$, with the deposition area defining a cylinder surrounding the target assembly with deposition being uniform for approximately 150 mm longitudinal length. Thus the area onto which substrates can be placed for uniform coating is approximately $1 \times 10^5$ mm$^2$.

In a prior art system, the same plasma source operating at similar conditions and directed onto a planar 100 mm diameter target through a magnetically induced 90 degree bend and voltage biased to 500V negative polarity would produce a deposition rate of less than 0.3 nm.s$^{-1}$ onto a uniform deposition area of approximately $8 \times 10^3$ mm$^2$.

Hence a sputter deposition system as herein described produces a deposition rate approximately four times that of a comparably operated state of the art sputter deposition system onto an area over twelve times as large. Thus for a given configuration, it produces a near fifty-fold increase in deposition capability.

Thus there is herein described a system in which an appropriately sized substantially cylindrical target is placed within a cylindrical plasma originating from a remote plasma source, which gives a dramatic improvement in deposition rate and deposition area. That the cylindrical plasma is not extinguished by placing the target within it is due to the plasma generation tube lying outside of and around the target. This configuration maximises the efficiency with which the plasma is used, as the target surface is in proximity to the whole of the plasma generation tube that propagates across the vacuum chamber.

In a first alternative embodiment of the invention, the target material 19 and mounting assembly 18 are of non-circular external cross section, for example hexagonal. This might be preferred over the original embodiment's substantially circular cross section in order for example to make construction easier or provide an improved uniformity of deposition to the substrates.

Figure 2:
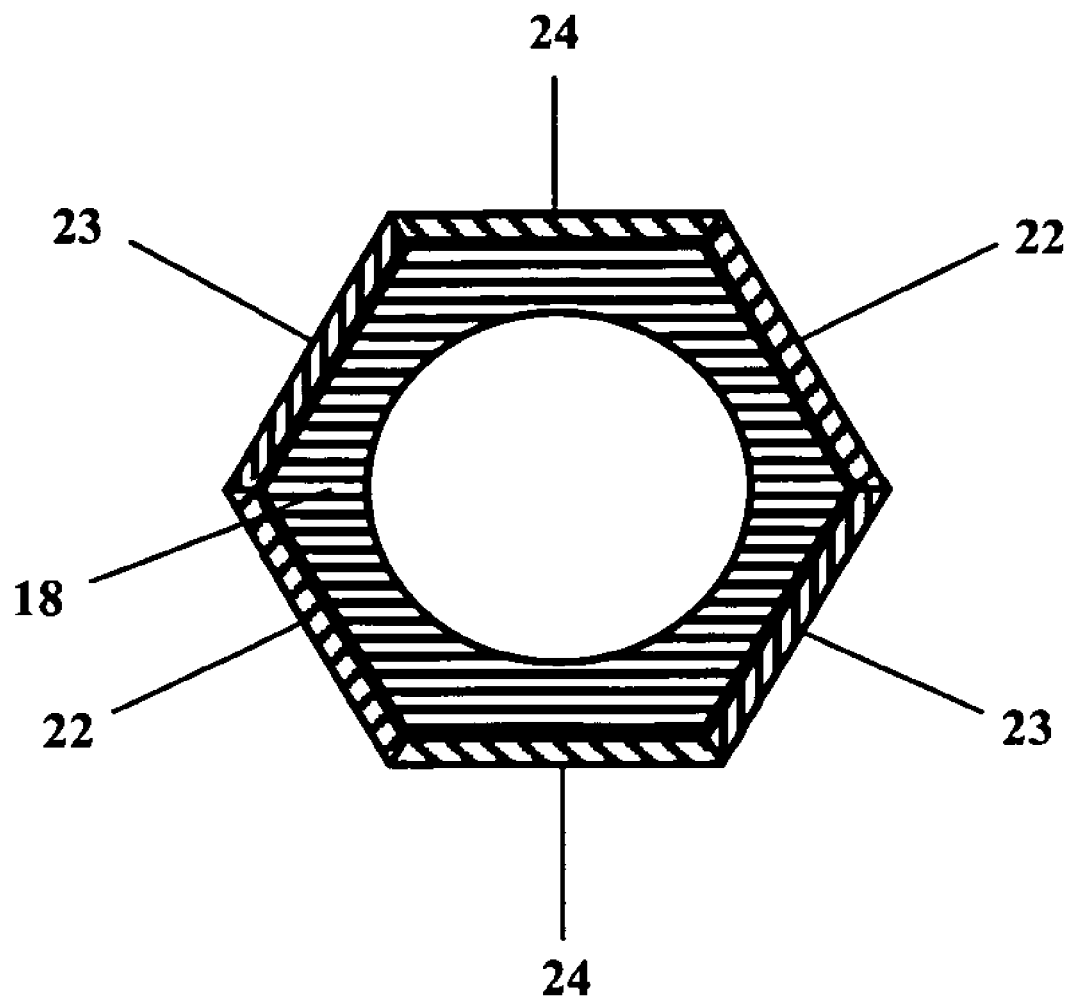
FIG. 2 is a schematic cross section of an alternative target assembly.

In a second alternative embodiment of the invention, shown in FIG. 2, the single target material 19 is replaced by two or more differing target materials, for example the three target materials 22 and 23 and 24, on a hexagonal cross section mounting assembly 18, so as to direct different material coatings to different regions of the vacuum chamber.

The target assembly can optionally include means to rotate it about its longitudinal axis. This allows for example the redirection of the materials to different substrate positions at choice and therefore provides a basis for sequential deposition of different thin film materials onto the substrates. Alternatively, the rotation can be continuous and sufficiently fast, for example 100 rpm, that the substrates effectively receive a thin film coating that is a mixture of the target materials. Both these capabilities have wide application in the thin film coatings industry.

In a third alternative embodiment of the invention, the target shield 20 is extended to cover the whole length of the target material and mounting assembly and includes apertures that thereby allow the plasma to interact with and sputter the target at only those places, thereby limiting and defining the target regions to be sputtered and the region of the vacuum chamber into which sputtering occurs. This embodiment is especially useful when combined with a target comprising several target materials and means of rotation as previously described as it is able to reduce cross-contamination of the materials at the substrates.

Further alternative embodiments are envisaged. For example, the remote plasma generation source needs only to provide a tubular generation region at its exit to the vacuum chamber and could therefore be provided for example by a 'helicon' antenna source. Alternative radio frequencies, for example 40 MHz, could be used to power the remote plasma source antenna. More than two electromagnets or permanent magnets could be used to guide and confine the plasma; for example an additional electromagnet placed between those shown in the preferred embodiment could be used to improve the magnetic confinement and thereby allow a longer target length to be used, with commensurate increase in the deposition area in which substrates could be placed.

The system can also be used in a reactive sputter process, that is a process in which a reactive gas or vapour is introduced via the gas feed system 10 to react with the sputtered target material or materials and thereby deposit a compound thin film on the substrate. For example, oxygen gas can be introduced into the sputter process with any of the embodiments previously described in order to deposit oxide thin films, for example to deposit alumina by sputtering of an aluminium target in the presence of oxygen gas or silica by sputtering of a silicon target in the presence of oxygen gas.

The invention claimed is:

1. A sputter coating system comprising:
   a vacuum chamber;
   means for generating a vacuum in the vacuum chamber;
   a gas feed system attached to the vacuum chamber;

a gas plasma forming system attached to the vacuum chamber comprising a radio frequency antenna and an electromagnet;

a system for confining and guiding a gas plasma within the vacuum chamber;

a sputter target assembly located within the chamber, the target assembly having an external cross-section defined by an outer surface of the target assembly, with the material to be sputtered forming at least the outer surface of the target assembly and positioned such that the outer surface is surrounded by the plasma within the vacuum chamber; and a system for applying a negative polarity voltage to the surface of the material to be sputtered such that sputtering occurs into a deposition area defining a cylinder surrounding the target, wherein said gas plasma forming system is attached to the vacuum chamber remote from the target assembly and accelerates plasma electrons to ionizing energies by the interaction of the radio frequency antenna and a magnetic field generated by the electromagnet, the gas plasma forming system having an exit to the vacuum chamber and a plasma generation region that is tubular at said exit to the vacuum chamber.

2. A sputter coating system according to claim 1, wherein the target assembly is cylindrical.

3. A sputter coating system according to claim 1, wherein the target assembly has a polygonal cross section.

4. A sputter coating system according to claim 1, wherein the surface of the target assembly comprises more than one type of material to be sputtered.

5. A sputter coating system according to claim 1, wherein said system for confining and guiding the plasma comprises at least two electromagnets, at least one of said electromagnets being controllable.

6. A sputter coating system according to claim 5, wherein said electromagnets have identical magnetic polarity.

7. A sputter coating system according to claim 4, wherein said system comprises a first electromagnet at a first end of said vacuum chamber and a second electromagnet at a second end of said vacuum chamber.

8. A sputter coating system according to claim 7, wherein said system further comprises a third electromagnet between said first and second controllable electromagnets.

9. A sputter coating system according to claim 5, wherein at least one of said electromagnets is permanent.

10. A sputter coating system according to claim 1, wherein said negative polarity voltage is applied continuously.

11. A sputter coating system according to claim 1, wherein said negative polarity voltage is applied intermittently.

12. A sputter coating system according to claim 1, wherein said voltage applied to said material is Radio Frequency.

13. A sputter coating system according to claim 1, wherein the plasma forming system includes a helicon antenna source.

14. A sputter coating system according to claim 1, wherein the plasma is constrained and guided across the vacuum chamber along a straight-line axis.

15. A sputter coating system according to claim 1, wherein the plasma produced by the plasma source has a density in excess of $10^{10}$ cm$^{-3}$ at one or more points within the vacuum chamber.

16. A sputter coating system according to claim 1, wherein the target assembly is rotatable.

17. A sputter coating system according to claim 1, wherein the target assembly comprises a water-cooled mounting assembly onto which the target material is fitted, and the mounting assembly is connected to a voltage source.

18. A sputter coating system according to claim 1, wherein the target assembly includes a shield to protect the mounting assembly.

19. A sputter coating system according to claim 18, wherein the shield further covers the target material, and the shield defines apertures through which the plasma enters and sputtered material exits.

20. A sputter coating system according to claim 1, further comprising a plurality of substrates positioned around the target assembly.

21. A sputter coating system according to claim 20, wherein the gas feed system is configured to introduce a gas into said vacuum chamber such that reactive sputtering occurs.

22. A method of sputter coating, comprising:

mounting a prism-shaped target assembly within a chamber, said target assembly having an outer surface comprising target material such that the target assembly has a polygonal external cross-section defined by said target material;

producing a vacuum within the chamber;

flowing a process gas into said chamber;

producing a magnetic field across said chamber;

applying radio frequency energy to an antenna to generate plasma within said chamber remote from the target assembly, such that said plasma has a tubular form, and the magnetic field confines and guides the plasma such that it surrounds the outer surface of the target assembly; and applying a negative polarity voltage to the prism-shaped target assembly, such that said target material is sputtered into a deposition area defining a cylinder surrounding the target.

23. A sputter coating system according to claim 1, wherein the target assembly comprises an elongate mounting assembly and target material fitted around and along the mounting assembly.

* * * * *